United States Patent
Dao et al.

(10) Patent No.: US 9,362,904 B2
(45) Date of Patent: Jun. 7, 2016

(54) DEVICES AND METHOD FOR TESTING POWER-ON RESET VOLTAGE

(71) Applicants: Chris C. Dao, Pflugerville, TX (US); Stefano Pietri, Lakeway, TX (US); Juxiang Ren, Austin, TX (US)

(72) Inventors: Chris C. Dao, Pflugerville, TX (US); Stefano Pietri, Lakeway, TX (US); Juxiang Ren, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 309 days.

(21) Appl. No.: 14/193,649

(22) Filed: Feb. 28, 2014

(65) Prior Publication Data
US 2015/0247893 A1 Sep. 3, 2015

(51) Int. Cl.
*G01R 31/3187* (2006.01)
*H03K 17/22* (2006.01)
*G01R 19/165* (2006.01)
*G06F 1/24* (2006.01)

(52) U.S. Cl.
CPC .......... *H03K 17/22* (2013.01); *G01R 19/16552* (2013.01); *G06F 1/24* (2013.01)

(58) Field of Classification Search
CPC .. G01R 31/2884; G01R 31/3004; G06F 1/24; G06F 1/30; G06F 1/3203; G06F 1/3209; H03K 17/22; H03K 17/30; H03K 17/223
See application file for complete search history.

(56) References Cited

U.S. PATENT DOCUMENTS

| | | | |
|---|---|---|---|
| 5,181,203 A | | 1/1993 | Frenkil |
| 5,203,000 A | * | 4/1993 | Folkes ...................... G06F 1/24 327/143 |
| 5,376,835 A | * | 12/1994 | Van Buskirk ........ H03K 17/223 327/143 |
| 5,450,417 A | | 9/1995 | Truong et al. |
| 7,519,486 B2 | | 4/2009 | Ng et al. |
| 7,710,105 B2 | | 5/2010 | Chan et al. |
| 2010/0060331 A1 | * | 3/2010 | Xiao ........................ G06F 1/24 327/143 |

* cited by examiner

*Primary Examiner* — Minh N Tang

(57) ABSTRACT

A system having a power on reset circuit including a voltage divide), a multiplexer coupled to two outputs of the voltage divider, a first comparator coupled to the multiplexer and a reference, a logic gate coupled to the first comparator, a second comparator coupled to one of the two outputs of the voltage divider, and an emulation gate coupled to the second comparator.

20 Claims, 3 Drawing Sheets

DEVICES AND METHOD FOR TESTING POWER-ON RESET VOLTAGE

BACKGROUND

1. Field of the Disclosure

The present disclosure relates in general to semiconductor devices, and more specifically to devices and methods for testing power-on reset voltage in a semiconductor device.

2. Description of the Related Art

During power-on reset of a semiconductor device, circuits remain turned off until a power on reset voltage reaches a specified level because the circuits may operate incorrectly if they are turned on before power supplied to them reaches the specified level. Similarly, circuits remain on until power-on reset voltage drops below the specified level. It is desirable to provide semiconductor devices with capability to test whether power-on reset voltage has reached the specified level before turning on and turning off the circuits.

BRIEF DESCRIPTION OF THE DRAWINGS

The benefits, features, and advantages of the present disclosure will become better understood with regard to the following description, and accompanying drawings where.

DETAILED DESCRIPTION

Embodiments of devices and methods disclosed herein provide semiconductor devices and methods for testing the level of power-on reset (POR) voltage before circuits in a semiconductor device are allowed to be powered on or powered down during reset sequences. An embodiment of a POR test circuit includes two comparators with active low outputs NOR'ed together to generate a POR signal for a semiconductor chip. In test mode, the trip point for one of the comparators is lowered by a specified amount, for example, 100 mV, to lower the chip POR trip point by the same amount. The POR trip point is defined to be the supply level at which the POR trips, so the trip point of the comparators will be a fraction of that lower due to resistor divider. The unaltered trip point of the second comparator is tested by lowering a supply voltage until the comparator trips to find a level at which the POR voltage is asserted. The supply voltage is then raised back up until the second comparator trips again to find a de-assertion level. The term "power-on reset de-assert" refers to a state at which a power-on reset signal goes from HIGH to LOW. The term "power-on reset assert" refers to a state at which a power-on reset signal goes from LOW to HIGH.

Figure 1:
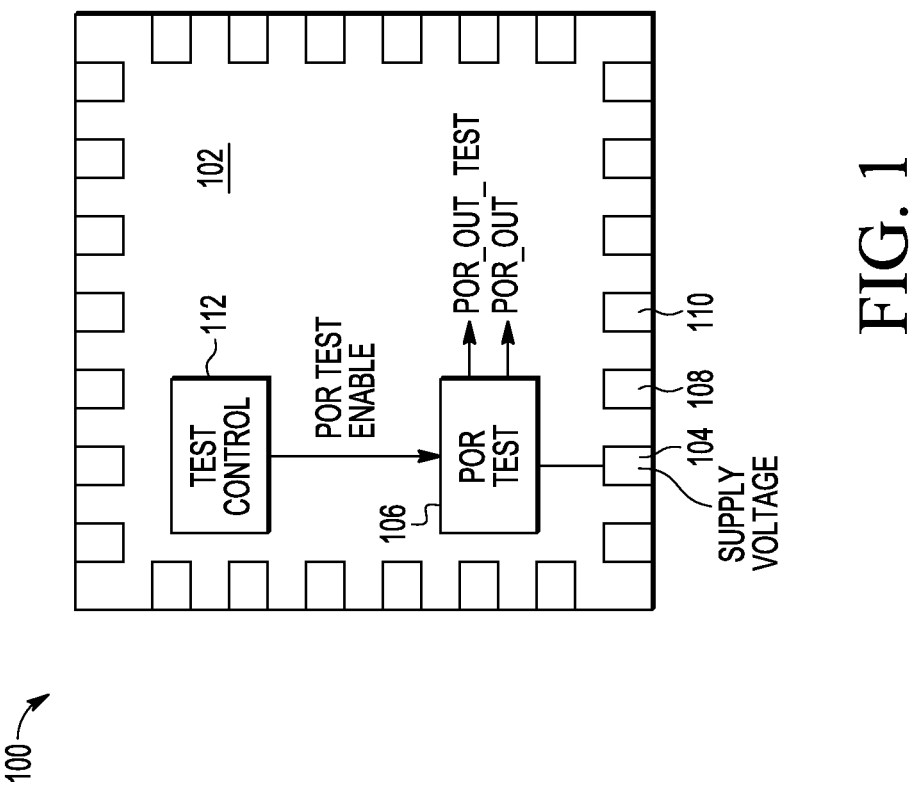
FIG. 1 is a block diagram of a semiconductor device according to one embodiment.

FIG. 1 is a block diagram of a semiconductor processing device 100 according to one embodiment that includes conductive pads 104, 108, 110 externally accessible around the perimeter of chip 102, and a power-on reset (POR) test module 106 and a test control module 112 implemented internally in device 100. The test control module 112 can be coupled to a conductive pad on device 100 to enable a user or automated test system to interface with test control 112. When operating, test control module 112 supplies a test enable signal to POR test module 106. A supply voltage such as VDD is provided to device 100, and in particular to POR test module 106 via conductive pad 104. POR test module 106 provides a POR out test signal (POR_OUT_TEST) that can be routed to one of conductive pads 108, 110 (or other conductive pad) to be accessed by an external device. The POR_OUT_TEST signal can be multiplexed with other test signals that are output from device 100. POR test module 106 also provides a POR out signal (POR_OUT) that is used within device 100 to determine when the POR voltage reaches a specified level.

Processing device 100 can be a microprocessor, an embedded processor, a microcontroller, or other suitable type of processor and can include one or more different types of memory (not shown) such as dynamic random access memory (DRAM), static RAM (SRAM), flash, and other suitable types of memory.

Figure 2:
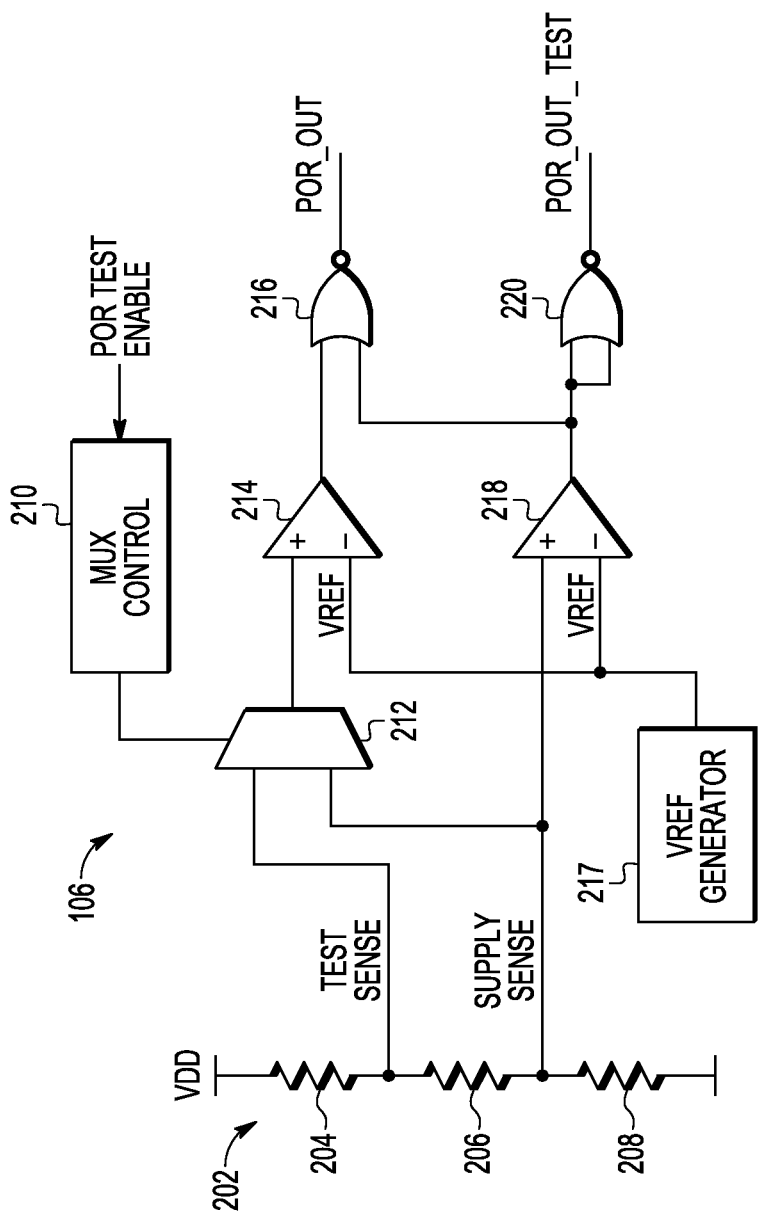
FIG. 2 is a schematic diagram of an embodiment of a power-on reset test module that can be implemented in the semiconductor device of FIG. 1.

FIG. 2 is a schematic diagram of an embodiment of power-on reset test module 106 that can be implemented in the semiconductor processing device 100 of FIG. 1 that includes a voltage divider 202 with resistive elements 204, 206, 208, a multiplexer control 210, a multiplexer 212, a first comparator 214, a logic gate 216, reference voltage (VREF) generator 217, a second comparator 218, and an emulation device 220. In the example shown, voltage divider 202 has resistive element 204 with a first end coupled to a supply voltage. Resistive elements 204, 206, 208 are coupled in series with one another with a second end of element 204 being coupled to a first end of element 206, a second end of element 206 being coupled to a first end of element 208 and a second end of element 208 being coupled to ground or a second supply voltage VSS. Resistive elements 204-208 can be implemented using resistors or other suitable devices that divide or reduce the supply voltage at different levels or taps. A test sense voltage is tapped between elements 204 and 206, and a supply sense voltage is tapped between elements 206 and 208. Thus, test sense voltage will have a value that is greater than the value of supply sense voltage. For example, in some embodiments, test sense voltage is approximately 100 mVolts greater than supply sense voltage, but other suitable values can be used. Further, although voltage divider 202 is shown with three resistive elements 204-208, voltage divider 202 can include any suitable number of resistive elements to provide the required levels of test sense voltage and supply sense voltage.

Test sense voltage is coupled as a first input of multiplexer 212 and supply sense voltage is coupled as a second input of multiplexer 212. Multiplexer control 210 provides a control signal to multiplexer 212 based on whether device 102 (FIG. 1) is being tested for POR performance. A POR test enable signal is provided to multiplexer control 210 from test control module 112 (FIG. 1) so that multiplexer control 210 controls multiplexer 212 to output the test sense voltage when the POR test enable signal indicates the POR voltage should be tested, and to output the supply sense voltage when not in POR test mode. The output of multiplexer 212 is provided to a positive input of comparator 214 and the reference voltage (VREF) is provided to a negative input of comparator 214. Note the inputs to comparators 214, 218 can be swapped if an AND gate is used instead of a NOR gate.

Figure 3:
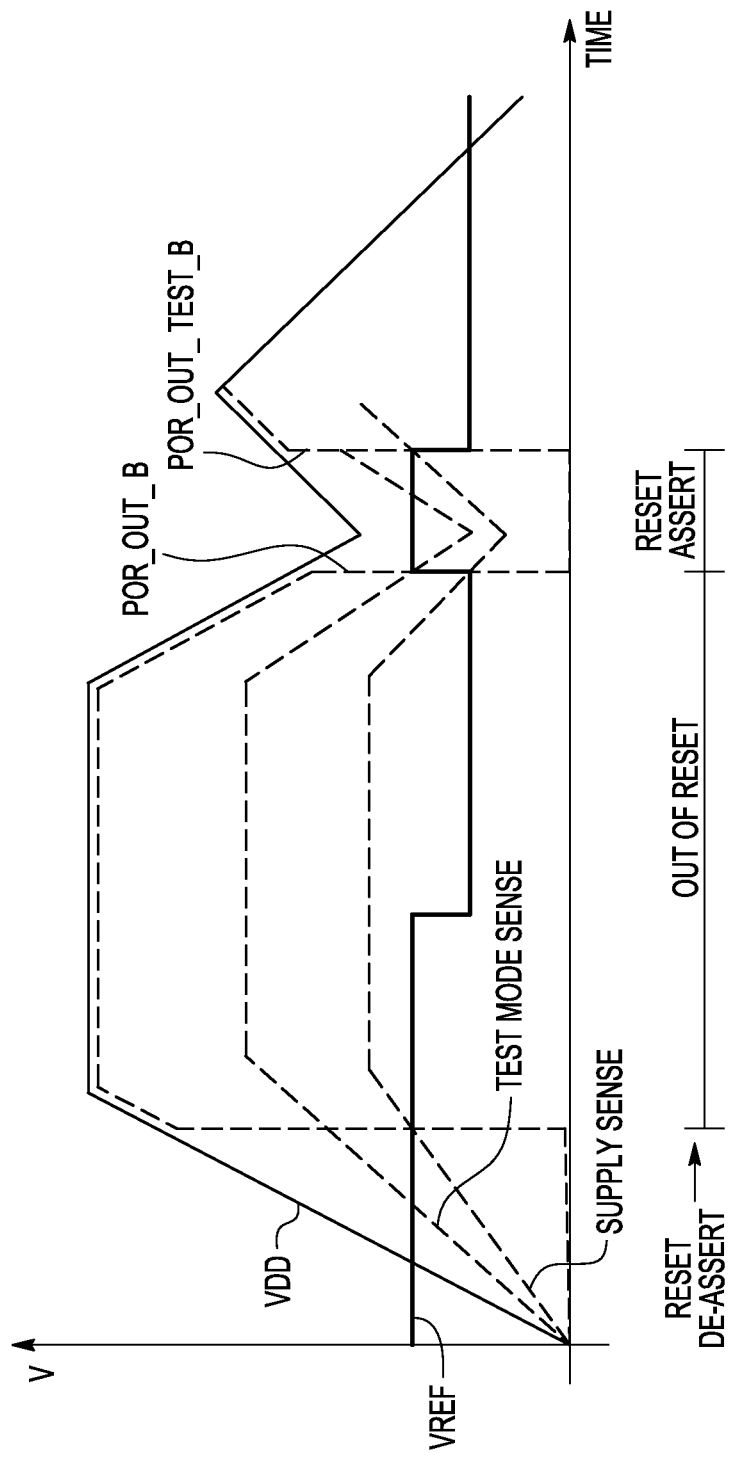
FIG. 3 is a timing diagram showing various voltage levels used in the POR test module of FIG. 2 during test mode.

Second comparator 218 has a positive input coupled to the supply sense voltage and a negative input coupled to VREF. VREF generator 217 can be included in POR test module 216 to provide the required level of reference voltage and may be implemented using one of many different ways. For example, the reference voltage could be generated using another voltage divider with resistors and/or diodes, or a bandgap reference or another reference generator like a delta Vgs (gate-source) reference. The value of the VREF may change during operating due to hysteresis, as shown in FIG. 3.

The output of comparator 214 is coupled to a first input of logic gate 216. The output of comparator 218 is coupled to a second input of logic gate. As shown, logic gate 216 can be a NOR gate that outputs a POR_OUT signal that is HIGH signal if both of the inputs are LOW. If either or both of the inputs are HIGH, the POR_OUT signal of the NOR gate is LOW. Other suitable logic devices, such as AND or XOR gates, can be used for logic gate 216 instead of or in addition to a NOR gate. The POR_OUT signal is provided to other components and circuits (not shown) in device 100 (FIG. 1).

The output of comparator 218 is coupled to first and second inputs of emulation device 220. As shown, emulation device 220 gate can be a NOR gate that outputs a POR_OUT_TEST signal that is HIGH if both of the inputs are LOW. If either or both of the inputs are HIGH, the POR_OUT_TEST signal is LOW.

Comparators 214, 218 can include identical components and the overall length of conductive lines connecting comparators 214, 218 to input signals is the same or as close as possible to being the same length. When the circuit is not in test mode, the inputs to comparators 214, 218 are the same. The POR_OUT signal from logic gate 216 depends on the outputs of both comparators 214, 218 and is provided to other components of device 100 (FIG. 1). The POR trip point in normal mode can be measured through comparator 218. The POR_TEST_OUT signal from emulation device 220 is used as a test signal for measurements of POR assert/de-assert power levels that depend on the output of comparator 218. Logic gate 216 and emulation device 220 can be NOR gates of the same size and layout. Other suitable logic devices can be used for emulation device 220 instead of or in addition to a NOR gate. For example, in some embodiments, the POR test circuit could include two comparators with active high outputs AND'ed together. The inputs to the two comparators would be swapped versus the configuration shown in FIG. 2. An XOR gate can also be used instead of a NOR or AND gate as well.

Referring to FIGS. 2 and 3, FIG. 3 is a timing diagram showing various voltage levels of signals used in the POR test module 106 of FIG. 2 during test mode. Note that the complements of the POR_OUT and POR_OUT_TEST signals are shown as POR_OUT_B and POR_OUT_TEST_B respectively in FIG. 3. In test mode, the positive input of comparator 214 is connected to the test sense voltage that is slightly higher than the supply sense voltage, so that the output of comparator 214 switches to logic 0 at a lower supply voltage (for example, 100 mV-150 mV lower or a voltage level that is still safe for the device to operate properly). Effectively, this will prevent device 100 from going into reset until the supply sense voltage is 100 mV-150 mV (or other selected value) lower than the test sense voltage, as shown during the reset assert portion of the x-axis of FIG. 3. If the POR trip point of the supply is 100 mV lower, then the supply sense voltage is a fraction of that lower than the test sense voltage due to the voltage divider 202. As the supply voltage is lowered until the output of comparator 218 trips to logic LOW, the supply voltage level can be recorded during test as "assertion" level". The supply voltage is then raised until the output of comparator 218 trips to logic HIGH, at which point the supply voltage level can be recorded as "de-assertion" level. Comparator 214 prevents device 100 from going into reset, which would disable the POR test module 106 and prevent the de-assertion level from being measured.

By now it should be appreciated that systems and methods have been disclosed that enable measurement of power-on reset voltage at assertion and de-assertion of reset. During power-on reset test mode, one comparator 214 provides voltages to circuits in the device 100 that prevent the device from going into reset while the output of another comparator 218 is measured to determine power-on reset assertion and de-assertion voltage levels. Knowledge of both assertion and de-assertion voltage levels helps ensure the power-on reset assert and de-assert levels are lower than low voltage detection modes. If a device 100 fails to start-up, the power-on reset assert and de-assert voltage levels can be checked to make sure they are within manufacturer specifications.

In some embodiments, a system (102) having a power on reset circuit can include a reset circuit that can comprise a voltage divider (202) coupled to a supply voltage terminal that has a first output (supply sense) and a second output (test sense), and a multiplexer (212) having a first input coupled to the first output, a second input coupled to the second output, and an output. A first comparator (214) has a first input coupled to the output of the multiplexer, a second input coupled to a reference (Vref), and an output. A logic gate (216) has a first input coupled to the output of the first comparator, a second input, and an output. The output of the logic gate is a power on reset terminal that provides a power on reset signal. A second comparator (218) has a first input coupled to the first output of the voltage divider, a second output coupled to the switchable reference, and an output coupled to the second input of the first logic gate. An emulation gate (220) has an input coupled to the output of the second comparator and an output. The output of the emulation gate is a power on reset test terminal that provides a power on reset test signal.

In another aspect, the system can be a semiconductor processing device which has circuitry enabled by the power on reset signal.

In another aspect, the semiconductor processing device can comprise a test control circuit (112) that is enabled by the power on reset signal and measures the power on reset test signal during a test mode.

In another aspect, the emulation gate comprises an emulation logic gate that can have two inputs coupled together and to the output of the second comparator.

In another aspect, the logic gate and emulation gate can be NOR gates of the same size and layout.

In another aspect, the system can be powered during a reset test mode in which the multiplexer couples the second output of the voltage divider to the first input of the first comparator. The second output provides a higher voltage than a voltage at the first output.

In another aspect, the system further comprises a test circuit that can monitor the power on reset test signal during the test mode. The test circuit receives power when the power on reset signal is active. The test circuit remains powered during the power on reset test signal switching logic states during the test mode.

In another aspect, the voltage divider can comprise a plurality of resistors (204, 206, 208) in series between a power supply terminal and a ground terminal. The first output of the voltage divider has a lower resistance path to the ground terminal than the second output of the voltage divider.

In another aspect, the system can further comprise a multiplexer control (210) having an output coupled to a select input of the multiplexer and an input for receiving a power on reset test enable signal provided by a test control of the system.

In another aspect, the system can further comprise operational circuitry (102) that receives power when the power on reset signal is active. The operational circuitry can comprise a test circuit that monitors an operation of the power on reset test signal. The power on reset test signal emulates operation of the power on reset signal. The emulation includes a transition from reset de-assert to out of reset and a transition from out of reset to reset assert.

In another aspect, the reference is switchable.

In another aspect, the reference switches from a first level to a second level after a transition of the system from a reset de-assert to out of reset. The first level is lower than the second level.

In another aspect, the reference is at the second level during a transition of the system from out of reset to reset assert.

In other embodiments, a system can comprise a power on reset circuit (210, 212, 214, 216) that selectively controls power to a circuit including test circuitry (112), based on a first input having a first correlation to a power supply voltage during normal operation and a second input having a second correlation to the power supply voltage during a test operation. The second correlation provides for allowing power to the circuit at a lower level of the power supply voltage than the first correlation. An emulation circuit (218, 220) uses the first input to emulate the power on reset circuit. The test circuitry tests the emulation circuit while being powered during the test operation in which the power on reset circuit is using the second input.

In another aspect, the power on reset circuit can comprise a multiplexer (212) that selects between the first input and the second input. The multiplexer can select the second input during the test mode.

In another aspect, the power on reset circuit can have a logic gate (216) that is the same size and layout of an emulation gate of the emulation circuit.

In another aspect, the logic gate can comprise a first NOR gate and the emulation circuit comprises a second NOR gate (220).

In another aspect, the first NOR gate receives an output of a first comparator (214) that is coupled to the multiplexer and an output of a second comparator (218) that is coupled to the first input. The second NOR gate has two inputs in which both are coupled to the output of the second comparator.

In still further embodiments, a method can comprise using a power on reset circuit (210, 212, 214, 216) to control power to a processing circuit that includes a test circuit (112). The power on reset circuit is responsive to a first input in a normal mode and a second input in a test mode. The first input has a first correlation to a power supply voltage and the second input has a second correlation to the power supply voltage. In the test mode, an emulation circuit (218, 220) is used to emulate an operation of the power on reset circuit in the normal mode, wherein the emulation circuit is responsive to the first input. Power to the test circuit is maintained with the power on reset circuit, while being responsive to the second input, to enable the test circuit to test the emulation circuit being responsive to the first input.

In another aspect, the first correlation and the second correlation linearly track the power supply voltage, wherein the second correlation is a higher fraction of the power supply voltage than the first correlation.

In another aspect, the power on reset circuit can comprise a first NOR gate (216) and the emulation circuit comprising a second NOR gate (220) having the same size and layout as the first NOR gate.

This disclosure is presented to enable one of ordinary skill in the art to make and use the present disclosure as provided within the context of a particular application and its requirements. Various modifications to the preferred embodiments will, however, be apparent to one skilled in the art, and the general principles defined herein may be applied to other embodiments. Therefore, the present disclosure is not intended to be limited to the particular embodiments shown and described herein, but is to be accorded the widest scope consistent with the principles and novel features herein disclosed.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of systems disclosed herein are circuitry located on a single integrated circuit or within a same device. Alternatively, the systems may include any number of separate integrated circuits or separate devices interconnected with each other. Also for example, a system or portions thereof may be soft or code representations of physical circuitry or of logical representations convertible into physical circuitry. As such, a system may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the present disclosure has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present disclosure without departing from the scope of the disclosure as defined by the appended claims.

What is claimed is:

1. A system having a power on reset circuit, wherein the power on reset circuit comprises:
   a voltage divider coupled to a supply voltage terminal that has a first output and a second output;
   a multiplexer having a first input coupled to the first output, a second input coupled to the second output, and an output; and
   a first comparator having a first input coupled to the output of the multiplexer, a second input coupled to a reference, and an output;
   a logic gate having a first input coupled to the output of the first comparator, a second input, and an output, wherein the output of the logic gate is a power on reset terminal that provides a power on reset signal;
   a second comparator having a first input coupled to the first output of the voltage divider, a second input coupled to the reference, and an output coupled to the second input of the logic gate; and
   an emulation gate having an input coupled to the output of the second comparator and an output, wherein the output of the emulation gate is a power on reset test terminal that provides a power on reset test signal.

2. The system of claim 1, wherein the system is a semiconductor processing device which has circuitry enabled by the power on reset signal.

3. The system of claim 2, wherein the semiconductor processing device comprises a test control circuit that is enabled by the power on reset signal and measures the power on reset test signal during a test mode.

4. The system of claim 1, wherein the emulation gate comprises an emulation logic gate having two inputs coupled together and to the output of the second comparator.

5. The system of claim 4, wherein the logic gate and emulation gate are NOR gates of the same size and layout.

6. The system of claim 1, wherein:
the system is powered during a reset test mode in which the multiplexer couples the second output of the voltage divider to the first input of the first comparator; and
the second output provides a higher voltage than a voltage at the first output.

7. The system of claim 6, wherein:
the system further comprises a test circuit that monitors the power on reset test signal during the test mode;
the test circuit receives power when the power on reset signal is active; and
the test circuit remains powered during the power on reset test signal switching logic states during the test mode.

8. The system of claim 1, wherein the voltage divider comprises a plurality of resistors in series between a power supply terminal and a ground terminal, wherein the first output of the voltage divider has a lower resistance path to the ground terminal than the second output of the voltage divider.

9. The system of claim 1, further comprising a multiplexer control having an output coupled to a select input of the multiplexer and an input for receiving a power on reset test enable signal provided by a test control of the system.

10. The system of claim 1, wherein:
the system further comprises operational circuitry that receives power when the power on reset signal is active;
the operational circuitry comprises a test circuit that monitors an operation of the power on reset test signal; and
the power on reset test signal emulates operation of the power on reset signal; and
the emulation includes a transition from reset de-assert to out of reset and a transition from out of reset to reset assert.

11. The system of claim 1, wherein the reference is switchable.

12. The system of claim 1, wherein the reference switches from a first level to a second level, wherein the first level is lower than the second level, after a transition of the system from a reset de-assert to out of reset.

13. The system of claim 12, wherein the reference is at the second level during a transition of the system from out of reset to reset assert.

14. A system comprising:
a power on reset circuit that selectively controls power to a circuit including test circuitry based on a first input having a first correlation to a power supply voltage during normal operation and a second input having a second correlation to the power supply voltage during a test operation, wherein the second correlation provides for allowing power to the circuit at a lower level of the power supply voltage than the first correlation; and
an emulation circuit that uses the first input to emulate the power on reset circuit,
wherein the test circuitry tests the emulation circuit while being powered during the test operation in which the power on reset circuit is using the second input.

15. The system of claim 14, wherein the power on reset circuit comprises a multiplexer that selects between the first input and the second input, wherein the multiplexer selects the second input during the test mode.

16. The system of claim 15, wherein the power on reset circuit has a logic gate (216) that is the same size and layout of an emulation gate of the emulation circuit, and the logic gate comprises a first NOR gate and the emulation circuit comprises a second NOR gate.

17. The system of claim 16, wherein:
the first NOR gate receives an output of a first comparator that is coupled to the multiplexer and an output of a second comparator that is coupled to the first input; and
the second NOR gate has two inputs in which both are coupled to the output of the second comparator.

18. A method, comprising:
using a power on reset circuit to control power to a processing circuit that includes a test circuit, wherein the power on reset circuit is responsive to a first input in a normal mode and a second input in a test mode, wherein the first input has a first correlation to a power supply voltage and the second input has a second correlation to the power supply voltage;
in the test mode, using an emulation circuit to emulate an operation of the power on reset circuit in the normal mode, wherein the emulation circuit is responsive to the first input; and
maintaining power to the test circuit with the power on reset circuit, while being responsive to the second input, enabling the test circuit to test the emulation circuit being responsive to the first input.

19. The method of claim 18, wherein the first correlation and the second correlation linearly track the power supply voltage, wherein the second correlation is a higher fraction of the power supply voltage than the first correlation.

20. The method of claim 18, wherein the using the power on reset circuit is further characterized by the power on reset circuit comprising a first NOR gate and the using the emulation circuit is further characterized by the emulation circuit comprising a second NOR gate having the same size and layout as the first NOR gate.

* * * * *